United States Patent
Go

(10) Patent No.: US 7,555,211 B2
(45) Date of Patent: Jun. 30, 2009

(54) NONADJUSTABLE FOCUSING TYPE CAMERA MODULE

(75) Inventor: Min Chul Go, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 449 days.

(21) Appl. No.: 11/319,738

(22) Filed: Dec. 29, 2005

(65) Prior Publication Data

US 2006/0228103 A1 Oct. 12, 2006

(30) Foreign Application Priority Data

Apr. 7, 2005 (KR) .................... 10-2005-0028821

(51) Int. Cl.
G03B 7/099 (2006.01)
G03B 17/00 (2006.01)
H04N 5/225 (2006.01)
F21V 9/04 (2006.01)

(52) U.S. Cl. .................. 396/268; 396/275; 396/448; 396/529; 348/340; 348/375; 359/819

(58) Field of Classification Search .............. 396/268, 396/275, 448, 529; 348/340, 375, 374; 250/216; 29/407.1; 359/820, 827, 819, 822, 823; 382/318
See application file for complete search history.

(56) References Cited

U.S. PATENT DOCUMENTS

| 6,483,101 | B1 * | 11/2002 | Webster ................ 250/216 |
| 6,665,455 | B1 * | 12/2003 | Ting ..................... 382/312 |
| 7,227,577 | B2 * | 6/2007 | Tanida et al. ............ 348/340 |
| 7,349,626 | B2 * | 3/2008 | Nishizawa ............... 396/275 |
| 7,379,113 | B2 * | 5/2008 | Kong et al. ............. 348/340 |
| 2002/0005997 | A1 | 1/2002 | Oba ..................... 359/819 |
| 2005/0041134 | A1 | 2/2005 | Takayama ................ 348/340 |
| 2006/0042064 | A1 * | 3/2006 | Montfort et al. .......... 29/407.1 |

(Continued)

FOREIGN PATENT DOCUMENTS

CN 1365221 A 8/2002

(Continued)

OTHER PUBLICATIONS

Korean Intellectual Property Office, Office Action mailed Oct. 28, 2006.

(Continued)

*Primary Examiner*—Melissa J Koval
(74) *Attorney, Agent, or Firm*—Lowe Hauptman Ham & Berner

(57) ABSTRACT

A nonadjustable focusing type camera module includes a lens assembly having at least one lens, a lens accommodating part mounted on an upper surface of a substrate, and a barrel having an inner space in which the lens assembly is arranged along an optical axis. An upper cap having an incident hole formed in a front center thereof is fixed to the upper side of the barrel to apply pressure to the lens assembly along the optical axis. The camera module further includes an image sensor having an image forming plane on which a light passed through the lens is focused. The sensor is electrically connected to the substrate to transmit the focused image, and a filter is disposed between the lens assembly and the image sensor.

22 Claims, 9 Drawing Sheets

U.S. PATENT DOCUMENTS

2007/0253697 A1* 11/2007 Kim et al. .................. 396/275
2008/0084619 A1* 4/2008 Lee ............................ 359/820
2008/0094738 A1* 4/2008 Lee ............................ 359/829

FOREIGN PATENT DOCUMENTS

| CN | 1482512 A | 3/2004 |
|---|---|---|
| CN | 1515950 A | 7/2004 |
| CN | 1591884 A | 3/2005 |
| JP | 59-068710 A | 4/1984 |
| JP | 2002-98878 A | 4/2002 |
| JP | 2005-64591 | 3/2006 |
| TW | M250470 U | 11/2004 |
| WO | 2004003618 A1 | 1/2004 |
| WO | 2005/020328 A1 | 3/2005 |

OTHER PUBLICATIONS

Chinese Intellectual Property Office, Office Action mailed, Apr. 27, 2007 and English Translation.
Taiwan Patent Office Examination Report issued Jul. 31, 2008.
Japanese Patent Office, Office Action issued Jan. 20, 2009.

* cited by examiner

NONADJUSTABLE FOCUSING TYPE CAMERA MODULE

RELATED APPLICATION

The present invention is based on, and claims priority from, Korean Application Number 2005-28821, filed Apr. 7, 2005, the disclosure of which is incorporated by reference herein in its entirety.

BACKGROUND OF THE INVENTION

1. Field of the Invention

The present invention relates to a camera module, and more particularly, to a camera module in which a component for accommodating a lens and components installed on a substrate are integrally formed into one body to simplify a mold, to reduce design time, to reduce manufacturing costs of the mold and material costs, and to minimize volume of the camera module.

2. Description of the Related Art

Generally, a camera module includes a lens part containing a lens, a housing coupled with the lens part, and a sensor part including an IR filter, an image sensor, and the like.

FIG. 1a is an exploded perspective view of the conventional camera module, and FIG. 1b is a vertical sectional view of the conventional camera module. As shown in the drawings, the lens part 110 includes a lens. 112, a barrel for accommodating the lens 112, and a cap 116 provided in the upper outer circumference of the barrel 114 and having an incident hole formed at the center thereof.

Meanwhile, at least one lens 112 may be installed in the barrel 114 according to function and performance of the camera module to be implemented.

The housing 122 has an inner hole 124 for accommodating the barrel 114. The inner hole 124 is coupled with the barrel 114 such that the lens part 110 and the housing 122 are coupled with each other. The barrel 114 has a male thread 114a formed in the outer circumference thereof and the inner hole 124 has a female thread 124a formed in the inner circumference thereof so that the male thread 114a is coupled with the female thread 124a, whereby the barrel 114 is movably installed in the housing 122 having a fixed position.

Meanwhile, the sensor part 130 is fixed in the housing 122. The sensor part 130 converts an image of an object being incident through the lens 130 into an electric signal to form an image.

To this end, the sensor part 130 includes an image sensor 132, the IR filter 134, and a substrate 136. The image of the object passes through the lens 130 is partially filtered by the IR filter 134 and is detected by the image sensor 132.

Moreover, since the image sensor 132 is electrically connected to the substrate 136, that is, an image transmission device such as a flexible printed circuit board (FPCB), the image of the object detected by the image sensor 132 is converted into an electric signal by the image sensor 132 and is transmitted to the substrate 136, then a display. (not shown) such as a liquid crystal display (LCD) forms the image on a screen.

Not described reference numeral 119 of FIG. 1b is assigned to a spacer for maintaining a gap between the lenses 112 accommodated in the barrel 114, and reference numeral 139 is assigned to an adhesive resin for fixing the IR filter 134.

Moreover, a barrel 114' having a male tread to couple the barrel 114' to the housing 122, as shown in FIG. 2, may be coupled with a cap 116' screwed to the lower side thereof such that the barrel 114' fixes the spacer 119 accommodated in the barrel 114 and associated with the lenses 112'.

However, since the barrels 114 and 114' and the housing 122 employed in the conventional camera module should be manufactured by separate molds due to the fact that the structure of the barrels 114 and 114' to accommodate the lenses 112 and 112' must be screwed to the housing 122, it takes a long time to design a new product and manufacturing costs and material costs are increased so that the camera module as a product loses competitiveness in view of costs and a limit to reduce its size.

There occurs deterioration of resolution, tilt, looseness or tightness according to the assembled state of the barrels 114 and 114' and the housing 122 with bolts because of the shape fitting problem of the barrels 114 and 114' and the housing 122 being manufactured by separate molds. Moreover, it takes a long time to assemble the barrels 114 and 114' with the housing 122 because of the small size of the lenses and the spacer assembled in the barrels 114 and 114' so that workability for the assembly is deteriorated.

Moreover, the housing 122 coupled with the barrels 114 and 114' is mounted on the substrate 136 having the image sensor 132 after installing the IR filter 134 to the lower side of the housing 122 or on the substrate 136 having the image sensor 132 on which the IR filter 134 is attached.

When the assembly of the housing 122 and the substrate 136 is finished, there are performed a series of processes including a focusing process of adjusting the focusing distance between the lenses 112 and 112' and the image sensor 132 with a naked eye or a software to optimize the focusing, a marking process of marking the optimal focus after the focusing process, a bonding process of coating UV bond on the cap 116, and a hardening process of hardening the coated UV bond using ultraviolet rays, that are required in assembling a focused camera module.

However, since a worker manually moves the barrels 114 and 114' screwed to the housing 122 to adjust the focus, there occurs a focusing difference of 20 μm to 30 μm according to the worker's skill. Due to distortion of the lenses arranged in the barrels during the marking process, there occurs a focusing difference of 10 μm to 20 μm, and there occurs a focusing difference of 20 μm to 30 μm due to the distortion of the lenses during the bonding process and the hardening process. Due to these focusing differences the resolution is deteriorated so that the reliability of the product decreases.

Particularly, when there is error in the focusing process, the resolution of the camera module deteriorates, and since it takes a long time to assemble and complete the camera module due to a complicated assembling process, the productivity is decreased.

Further, since the male threads 114a and 114a' of the barrels 114 and 114' and the female thread 124a of the housing 122 are fastened with each other, when foreign matter remaining in the male threads 114a and the 114a' or the female thread 124a drops down on the IR filter 134, the foreign matter covers pixels of the image sensor when the image of the object is displayed so that a black spot appears on a screen in the image where the image is displayed. Thus, the reliability of the product is deteriorated.

SUMMARY OF THE INVENTION

Therefore, the present invention has been made in view of the above problems, and it is an object of the present invention to provide a nonadjustable focusing type camera module in which a component for accommodating a lens and components installed on a substrate are integrally formed into one body to simplify a mold, to reduce design time, to reduce manufacturing costs of the mold and material costs, and to minimize the volume of the camera module.

It is another object of the present invention to provide a nonadjustable focusing type camera module in which the manufacturing process is simple so as to reduce the number of workers, to improve workability, and to save the investment for the plant.

It is still another object of the present invention to provide a nonadjustable focusing type camera module in which image deterioration caused by foreign matter dropped down on a sensor part is prevented to enhance the reliability of the product.

In accordance with an object of the present invention, the above and other objects can be accomplished by the provision of a nonadjustable focusing type camera module including a lens assembly including at least one lens, a lens accommodating part mounted on an upper surface of a substrate, and including a barrel having an inner space in which the lens assembly is arranged along an optical axis, and an upper cap having an incident hole formed in the front center thereof and fixed to the upper side of the barrel to apply pressure to the lens assembly along the optical axis, an image sensor having an image forming plane on which a light beam passed through the lens is focused and electrically connected to the substrate to transmit the focused image, and at least one filter disposed between the lens assembly and the image sensor.

Preferably, the lens assembly includes at least one spacer for maintaining a gap between the lenses.

Preferably, the barrel includes a first coupling part formed in the upper side corresponding to the lower side of the upper cap, and the upper cap includes a first corresponding coupling part coupled with the first coupling part. The first coupling part and the first corresponding coupling part have a female thread and a male thread to be screwed to each other respectively.

Preferably, the barrel includes at least one first upper positioning part formed in the lower end thereof corresponding to the upper surface of the substrate, and the substrate includes a first lower positioning part formed in the upper surface thereof corresponding to the upper end of the barrel and coupled with the first upper positioning part. The first upper positioning part and the first lower positioning part are formed in the form of a pin and a pinhole respectively such that the first upper positioning part is inserted into the first lower positioning part.

Preferably, the barrel includes a stopper protruded from the inner surface thereof to lock an end lens of the lens assembly.

Preferably, the filter may be an IR filter positioned and fixed to the lower end of the barrel by adhesive.

Preferably, the filter may be an IR filter attached to the upper surface of the image sensor corresponding to an image region of the image sensor.

Preferably, a back focal length between an end lens of the lens assembly and the image forming plane of the image sensor is maintained within an error range of ±20 μm.

Preferably, the image sensor may be a sensor mounted on the upper surface of the substrate by wire-bonding.

Preferably, the image sensor may be a sensor mounted on the lower surface of the substrate by flip-chip bonding such that the image forming plane is exposed through a window penetrating the upper surface of the substrate.

In order to accomplish the object of the present invention, the present invention also provides a nonadjustable focusing type camera module including a lens assembly including at least one lens, a lens accommodating part mounted on an upper surface of a substrate, and including a barrel having an inner space in which the lens assembly is arrange along an optical axis and an incident hole formed in the front center thereof, and a lower cap fixed to the lower side of the barrel to apply pressure to the lens assembly along the optical axis, an image sensor having an image forming plane on which a light beam passed through the lens is focused and electrically connected to the substrate to transmit the focused image, and at least one filter disposed between the lens assembly and the image sensor.

Preferably, the lens assembly includes at least one spacer for maintaining a gap between the lenses.

Preferably, the barrel includes at least one second upper positioning part formed in the lower end thereof corresponding to the upper surface of the substrate, and the substrate includes a second lower positioning part formed in the upper surface thereof corresponding to the upper end of the barrel and coupled with the first upper positioning part. The second upper positioning part and the second lower positioning part are formed in the form of a pin and a pinhole respectively such that the second upper positioning part is inserted into the second lower positioning part.

Preferably, the lower cap includes a pressing member fitted into the inner circumference of the barrel by an external force applied from the lower side of the barrel to the lens assembly.

Preferably, the lower cap includes a ring-shaped member having a predetermined opening formed in the central portion thereof through which the light beam entering through the incident hole and the lens assembly passes toward the image sensor without interference.

Preferably, the lower cap includes a transparent cylindrical member through which the light beam passes toward the image sensor without refraction.

Preferably, the filter may be an IR filter positioned and fixed to the lower end of the barrel by adhesive.

Preferably, the filter may be an IR filter attached to the upper surface of the image sensor corresponding to an image region of the image sensor.

Preferably, a back focal length between an end lens of the lens assembly and the image forming plane of the image sensor is maintained within an error range of ±20 μm.

Preferably, the image sensor may be a sensor mounted on the upper surface of the substrate in a wire-bonding.

Preferably, the image sensor may be a sensor mounted on the lower surface of the substrate by flip-chip bonding such that the image forming plane is exposed through a window penetrating the upper surface of the substrate.

BRIEF DESCRIPTION OF THE DRAWINGS

These and/or other objects and advantages of the present invention will become apparent and more readily appreciated from the following description of the embodiments, taken in conjunction with the accompanying drawings, in which.

DESCRIPTION OF THE PREFERRED EMBODIMENTS

Hereinafter, the present invention will be described in detail with reference to the accompanying drawings as follows.

Figure 1A:
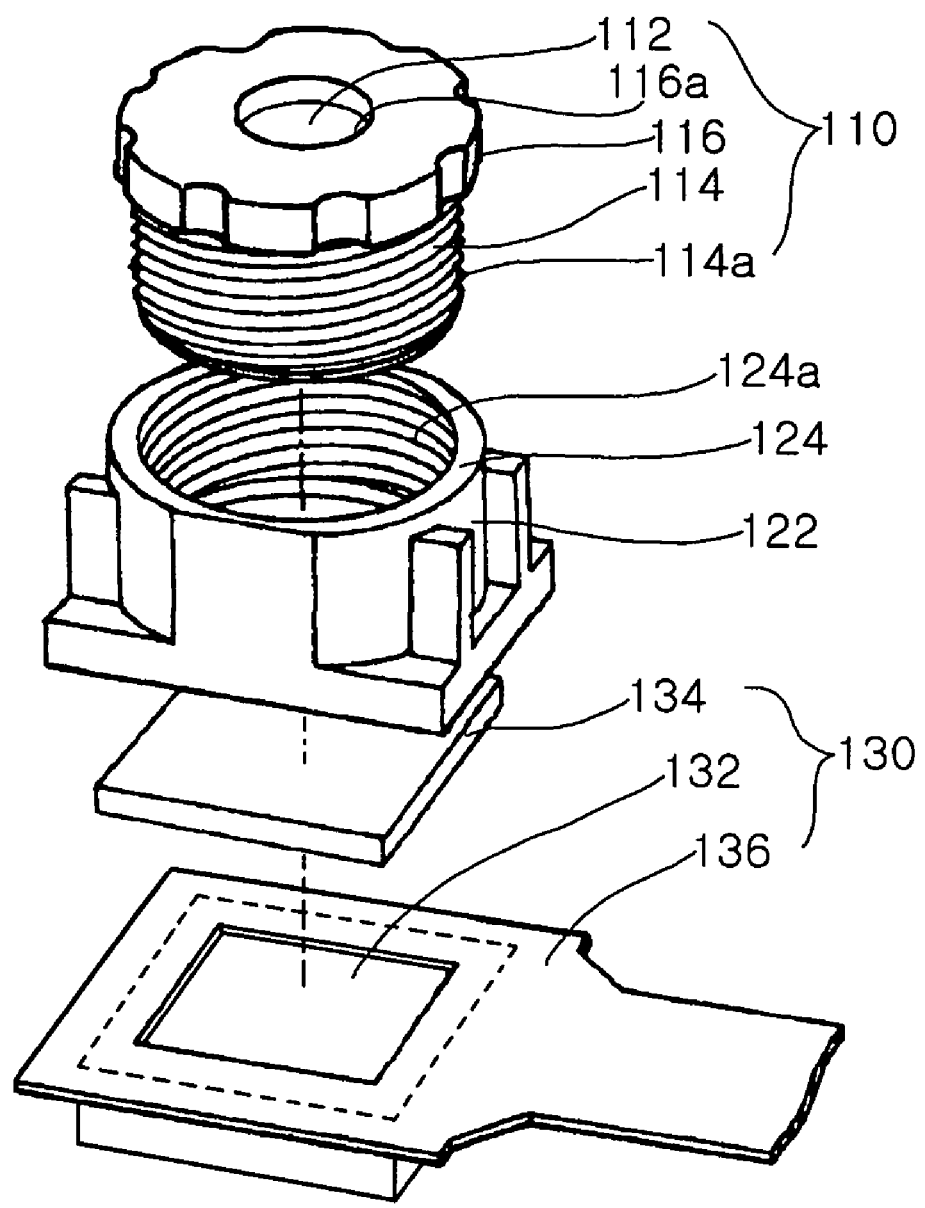
FIG. 1a is an exploded perspective view of the conventional camera module.
Figure 1B:
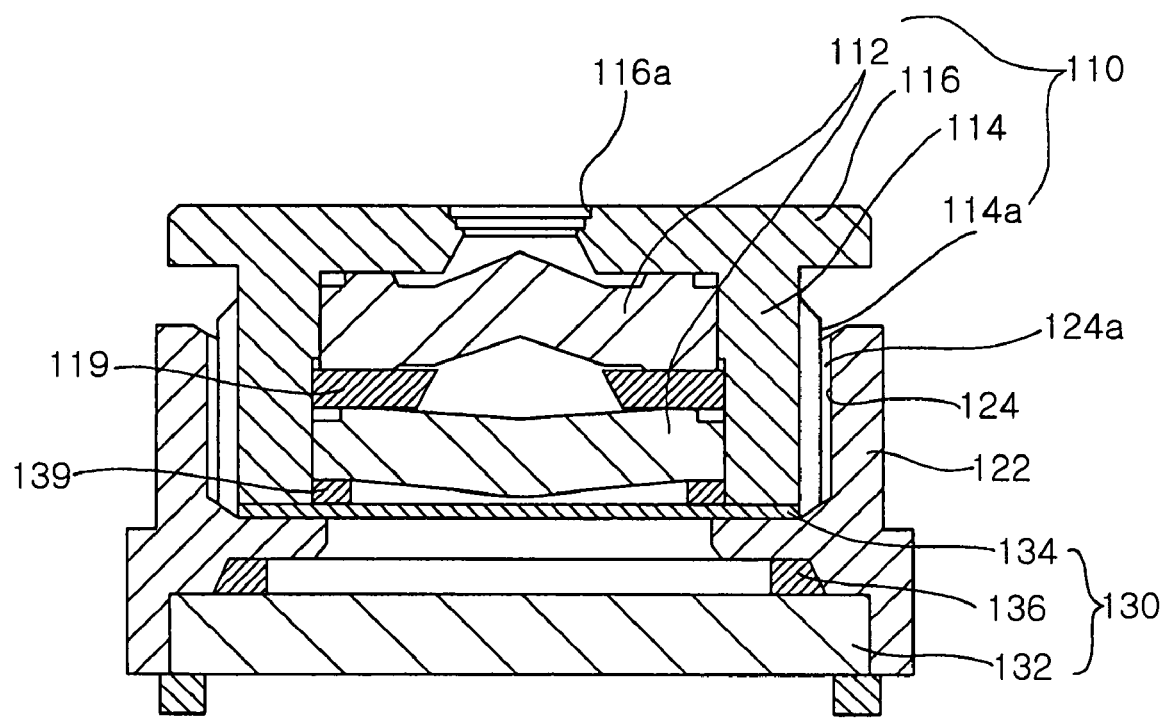
FIG. 1b is a sectional view illustrating an assembly of the conventional camera module.
Figure 2:
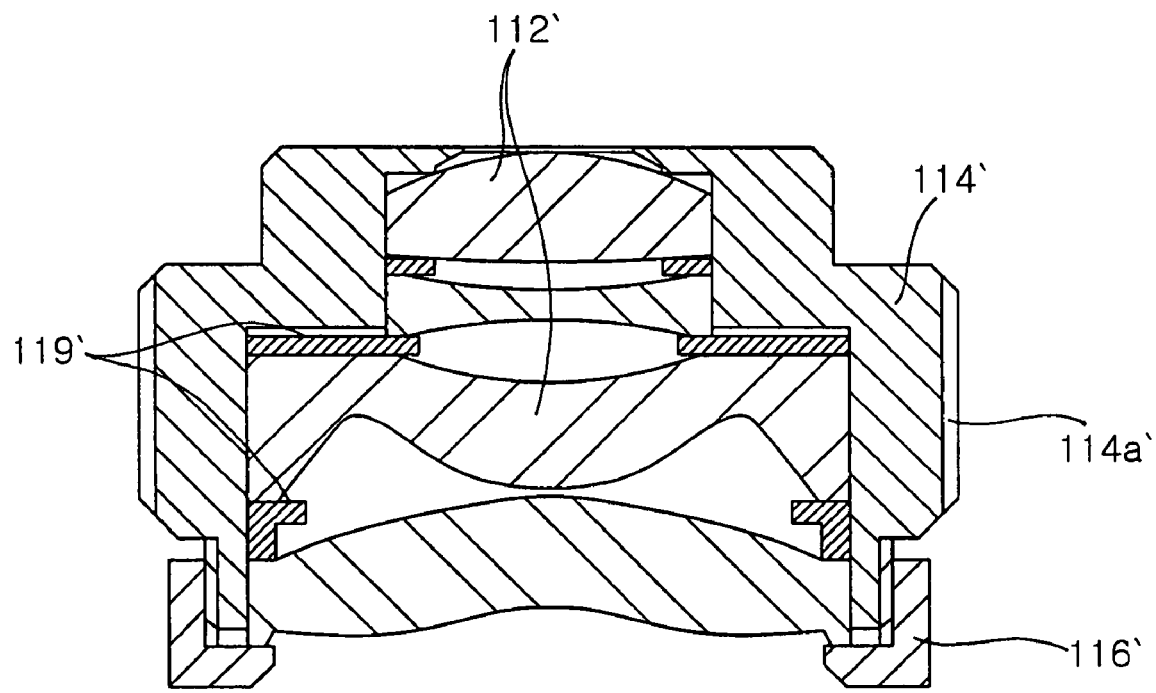
FIG. 2 is a sectional view illustrating an assembly of another barrel and a cap provided in the conventional camera module.
Figure 3A:
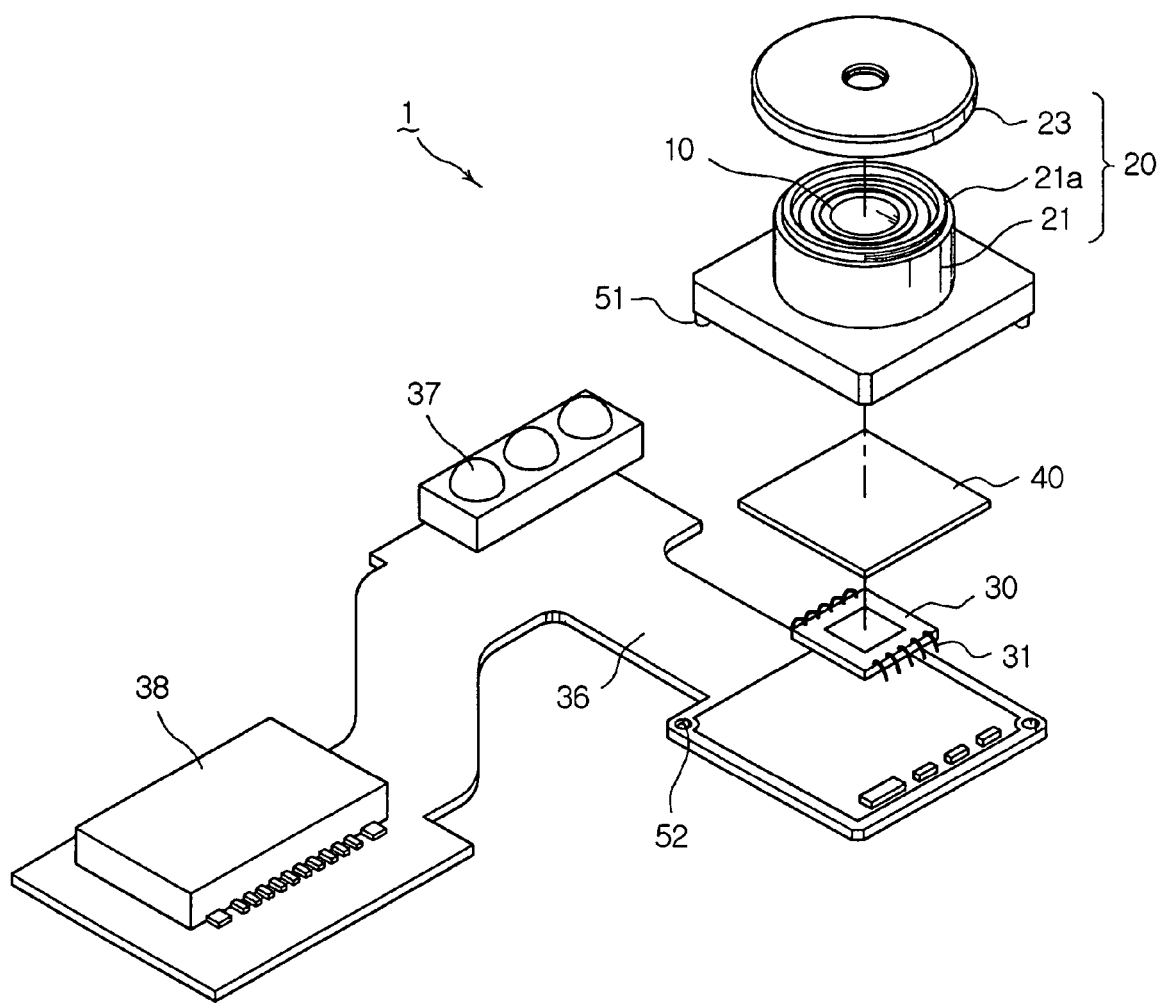
FIG. 3a is an exploded perspective view of the nonadjustable focusing type camera module according to the first preferred embodiment of the present invention.
Figure 3B:
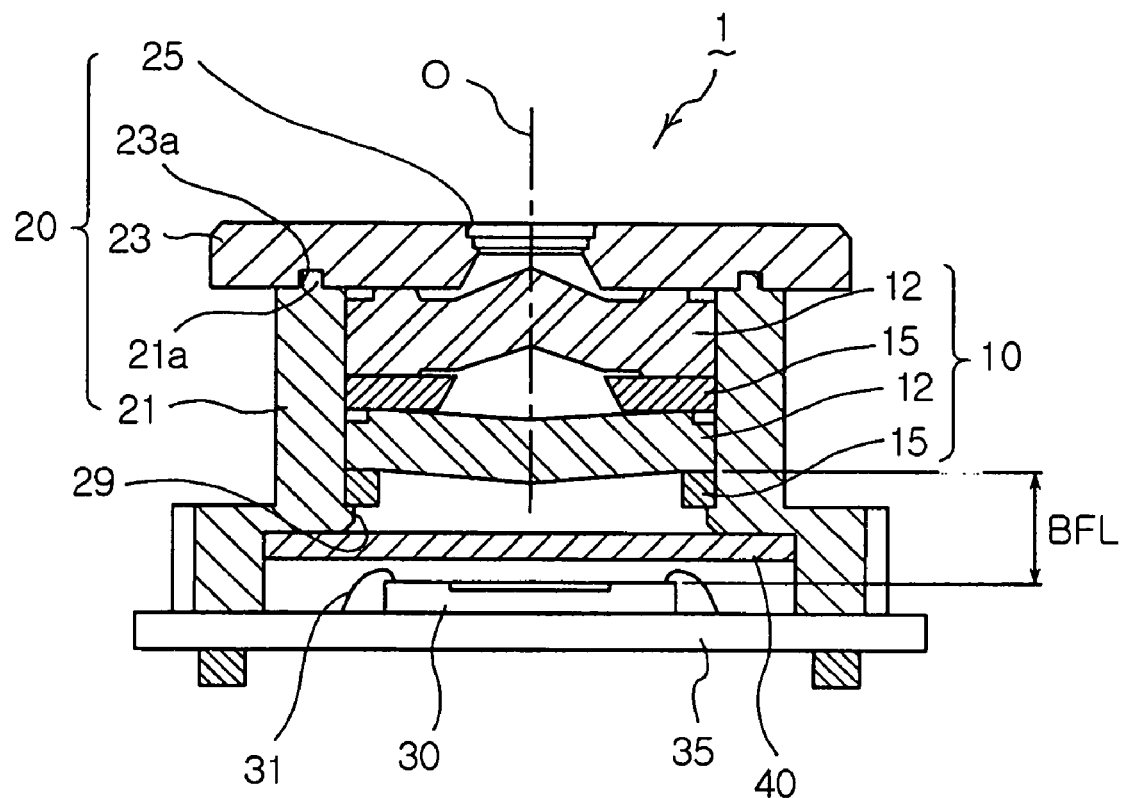
FIG. 3b is a sectional view illustrating an assembly of the nonadjustable focusing type camera module according to the first preferred embodiment of the present invention.

FIG. 3 is a view illustrating a nonadjustable focusing type camera module according to a first preferred embodiment of the present invention, in which FIG. 3a is an exploded perspective view of the nonadjustable focusing type camera module according to the first preferred embodiment of the present invention, and FIG. 3b is a sectional view illustrating an assembly of the nonadjustable focusing type camera module according to the first preferred embodiment of the present invention. The camera module 1 according to the first preferred embodiment of the present invention includes a lens assembly 10, a lens accommodating part 20, an image sensor 30, and a filter member 40.

In other words, the lens assembly 12 includes at least one lens 12 arranged along the optical axis O and is accommodated in the lens accommodating part 20 having a predetermined inner space.

The lenses 12 arranged in the lens accommodating part 20 have spacers 15 for maintaining predetermined gaps between the lenses 12.

Each the spacer 15 has an opening of a predetermined size such that a light beam passing through the lens assembly 10 is projected onto the image sensor 30 without interference to form an image.

Moreover, the lens accommodating part 20 is an accommodating member which has an incident hole 25 formed in the front center thereof and aligned with the optical axis O and an inner space, formed therein, in which the lenses 12 of the lens assembly 10 are arranged along the optical axis O.

The lens accommodating part 20, as shown in FIGS. 3a and 3b, includes a hollow cylindrical barrel 21 and a disc-shaped upper cap 23 coupled with the upper side of the barrel 21.

The barrel 21 is a hollow cylindrical accommodating member having an inner space, formed therein and having a predetermined size, in which the lens assembly 10 is arranged, and a first coupling part 21a formed in the upper side corresponding to the lower side of the upper cap 23 and coupled with a first corresponding coupling part 23a of the upper cap 23.

The upper cap 23 has the incident hole 25 formed in the front center thereof perpendicular to the optical axis O and having a predetermined size, and the corresponding coupling part 23a formed in the lower side corresponding to the first coupling part 21a of the barrel 21 and coupled with the first coupling part 21a.

Here, the first coupling part 21a may be formed in the form of male thread protruded from the upper side of the barrel 21 to be coupled with the ring-shaped first corresponding coupling part 23a formed in the lower side of the upper cap 23 in the form of female thread concaved from the lower side of the cupper cap 23, but is not limited to this, and may be formed in the upper side of the barrel 21 in the form of the female thread to be coupled with the ring-shaped first corresponding coupling part 23a in the form of male thread protruded from the lower side of the upper cap 23.

Moreover, the barrel 23 includes a protruded stopper 29 for blocking an end lens 12 constituting the lens assembly 10 or the spacer 15 to prevent the lens assembly 10 pressed in the optical axis from separating from the lower side of the barrel 23 when the barrel 21 is coupled with the upper cap 23. The position from which the stopper 29 is protruded can be varied according to the number of the lenses 12 provided in the lens assembly 10.

The lens accommodating part 20 is mounted on and fixed to the upper surface of a substrate 35 such as a printed circuit board in which pattern circuits are printed or the FPCB by bonding the lower end of the lens accommodating part 20 to the upper side of the substrate 35 with adhesive.

Additionally, the barrel 21 constituting the lens accommodating part 20 includes at least one first upper positioning part 51 formed in the lower side corresponding to the upper surface of the substrate 35, and the substrate 35 includes a first lower positioning part 52 coupled with the first upper positioning part 51 and formed in the upper surface corresponding to the lower end of the barrel 21.

Here, the first upper positioning part 51 is formed in the form of a pin protruded from the lower end of the barrel 21 and the first lower positioning part 52 is concaved from the upper surface of the substrate 35 and is formed in the form of a pinhole through which the first lower positioning part 52 is inserted, but not limited to this, or the first upper positioning part 51 is formed in the form of a pinhole concaved from the lower end of the barrel 21 and the second lower positioning part 52 may be formed in the form of a pin protruded from the upper surface of the substrate 35 and inserted into the pinhole.

Meanwhile, the image sensor 30, as shown in FIGS. 3a and 3b, includes an image forming plane on which the light beam passed through the lens 12 and focused forms an image, is mounted to a side of the substrate 35, and is electrically connected to an image processor provided in the substrate 35 to convert the formed image into an electric signal and transmit the converted electric signal to a displaying part.

The image sensor 30 may be mounted on the upper surface of the substrate 35 by a conductive wire 31 by a wire boding method, but not limited to this.

Figure 4:
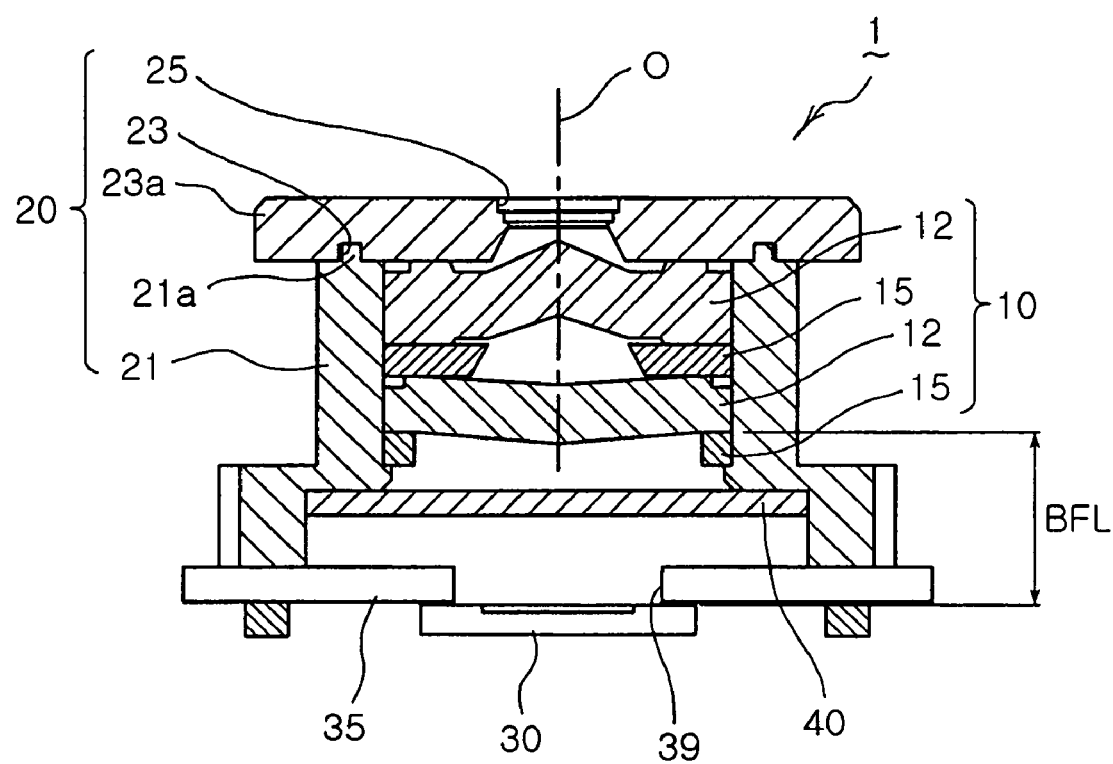
FIG. 4 is a sectional view illustrating an assembly of a nonadjustable focusing type camera module according to a second preferred embodiment of the present invention.

FIG. 4 is a sectional view illustrating an assembly of a nonadjustable focusing type camera module according to a second preferred embodiment of the present invention. As shown in the drawing, the image sensor 30 may be mounted on the lower surface of the substrate 35 having a window 39 in a flip-chip bonding such that the image forming plane provided in the upper surface of the image sensor 30 can be exposed to the exterior.

The substrate 35 in which the image sensor 30 is installed in a side thereof includes a connector 38 electrically connected to a light source 37 for emitting light when electric power is applied and a main substrate (not shown).

Moreover, the filter 40 is a transparent IR filter which is disposed between the end lens 12 of the lens assembly 10 and the image sensor 30 and cuts ultraviolet rays contained in the light forming an image on the image forming plane of the image sensor 30.

The filter 40, as shown in FIGS. 3 and 4, may be fixed to the lower end of the barrel 21 by adhesive coated on the outer rim thereof, but not limited to this, and may be integrally formed in the image forming plane corresponding to the image region of the image sensor 30.

Figure 5A:
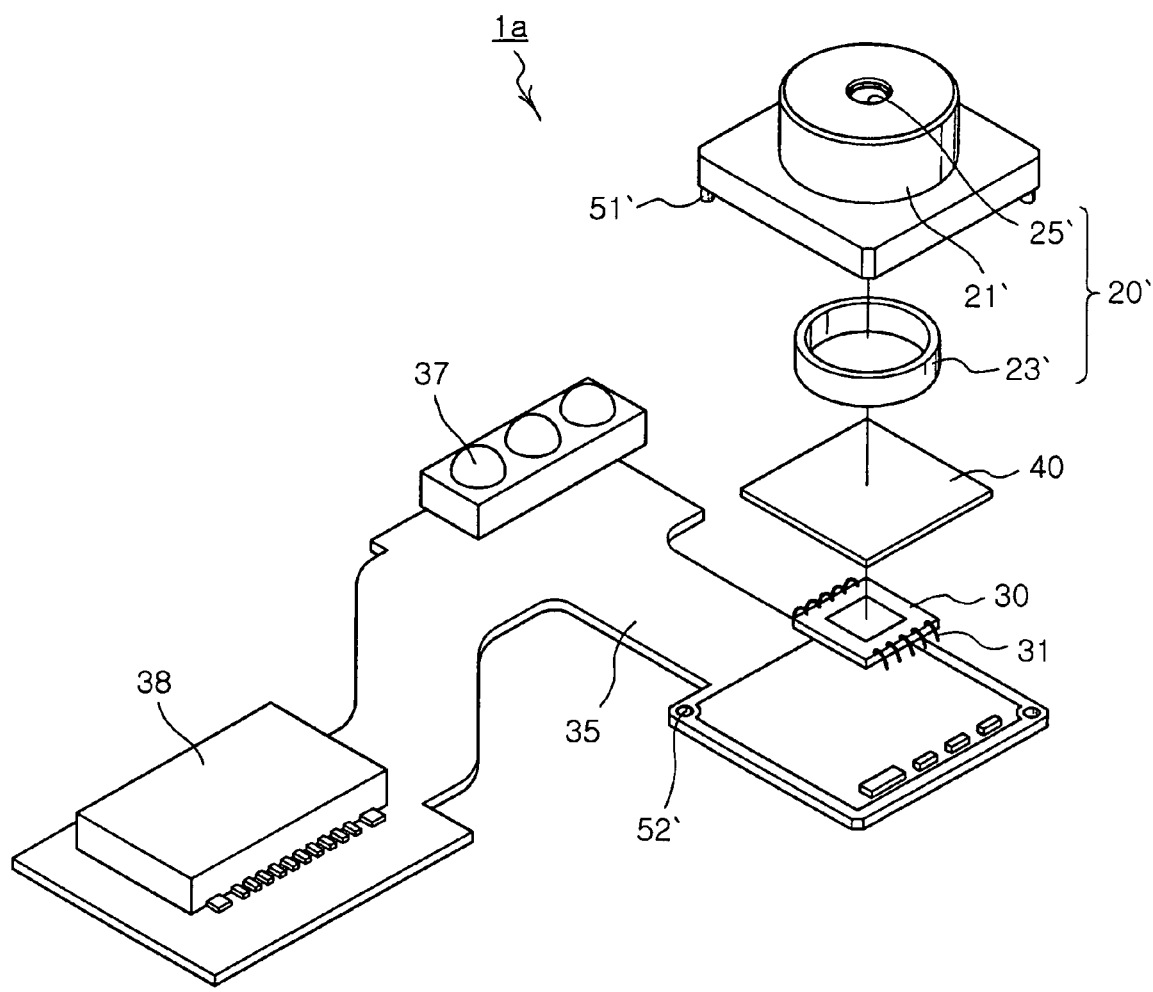
FIG. 5a is an exploded perspective view of the nonadjustable focusing type camera module according to the third preferred embodiment of the present invention.
Figure 5B:
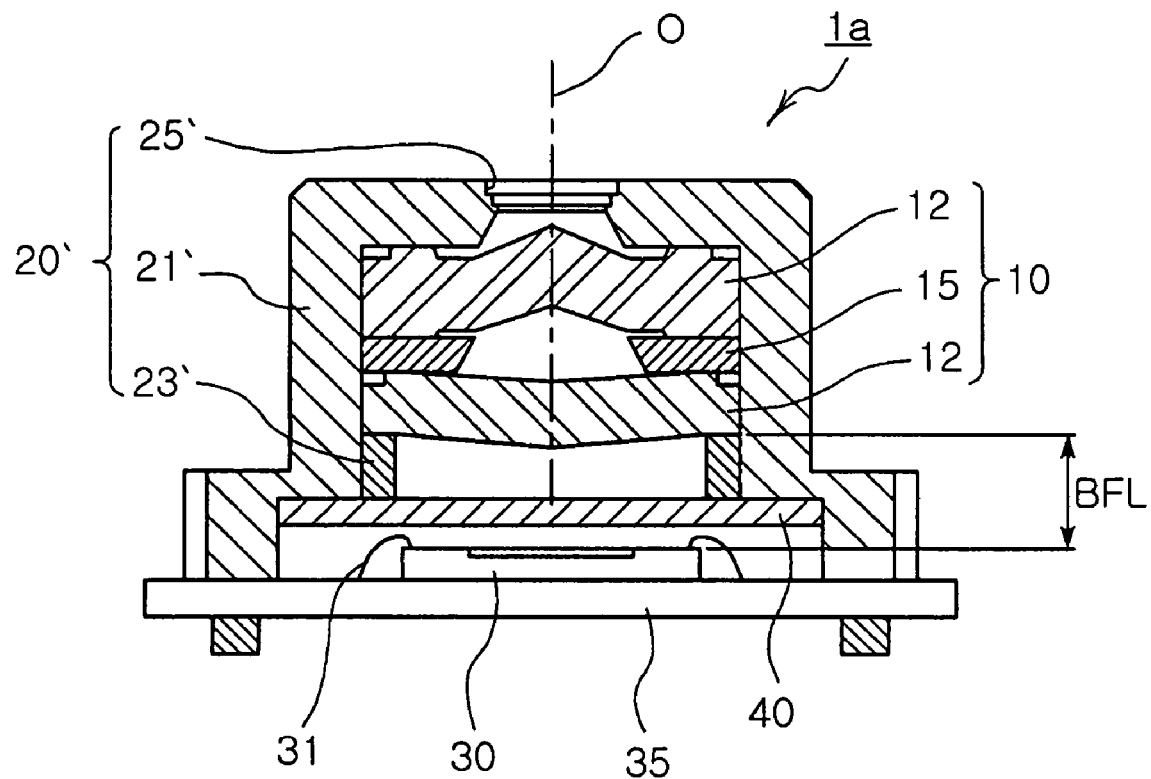
FIG. 5b is a sectional view illustrating an assembly of the nonadjustable focusing type camera module according to the third preferred embodiment of the present invention.

FIG. 5 is a view illustrating a nonadjustable focusing type camera module according to a third preferred embodiment of the present invention, in which FIG. 5a is an exploded perspective view of the nonadjustable focusing type camera module according to the third preferred embodiment of the present invention, and FIG. 5b is a sectional view illustrating an assembly of the nonadjustable focusing type camera module according to the third preferred embodiment of the present invention. The camera module 1 according to the second preferred embodiment of the present invention includes a lens assembly 10, a lens accommodating part 20', an image sensor 30, and a filter 40. In this embodiment, similar numerals are assigned to similar components and their description will be omitted.

The lens accommodating part 20', as shown in FIGS. 5a and 5b, includes a barrel 21' and a lower cap 23' fitted into the lower end of the barrel 21'.

The hollow cylindrical barrel 21' has a predetermined inner space in which the lens assembly 10 is inserted into the upper side of the barrel 21' from the lower side of the barrel 21' and arranged along the optical axis O, and an incident hole 25' formed in the front center thereof perpendicular to the optical axis O.

Here, the lower end of the barrel 21' and the upper surface of the substrate 35 have at least one second upper positioning part 51' and at least one second lower positioning part 52 respectively such that the lens accommodating part 20' and the substrate 35 are easily coupled with each other.

The second upper positioning part 51' and the second lower positioning part 52' are formed in the form of a pin and a pinhole such that the second upper positioning part 51 is inserted into the second lower positioning part 52'.

Moreover, the lower cap 23' is a pressing member whose outer circumference is fitted into the lower inner circumference of the barrel 21' by an external force applied to the lens assembly 10 from the lower side of the barrel 21', and applies pressure to the lens assembly 10 toward the incident hole 25' along the optical axis to hold the lens assembly 10.

The lower cap 23' may be a ring-shaped member having a predetermined opening formed in the central portion thereof through which the light beam entering through the incident hole 25' and the lens assembly 10 passes toward the image sensor 20 without interference, or may be a transparent cylindrical member through which the light beam passes toward the image sensor 30 without refraction.

Figure 6:
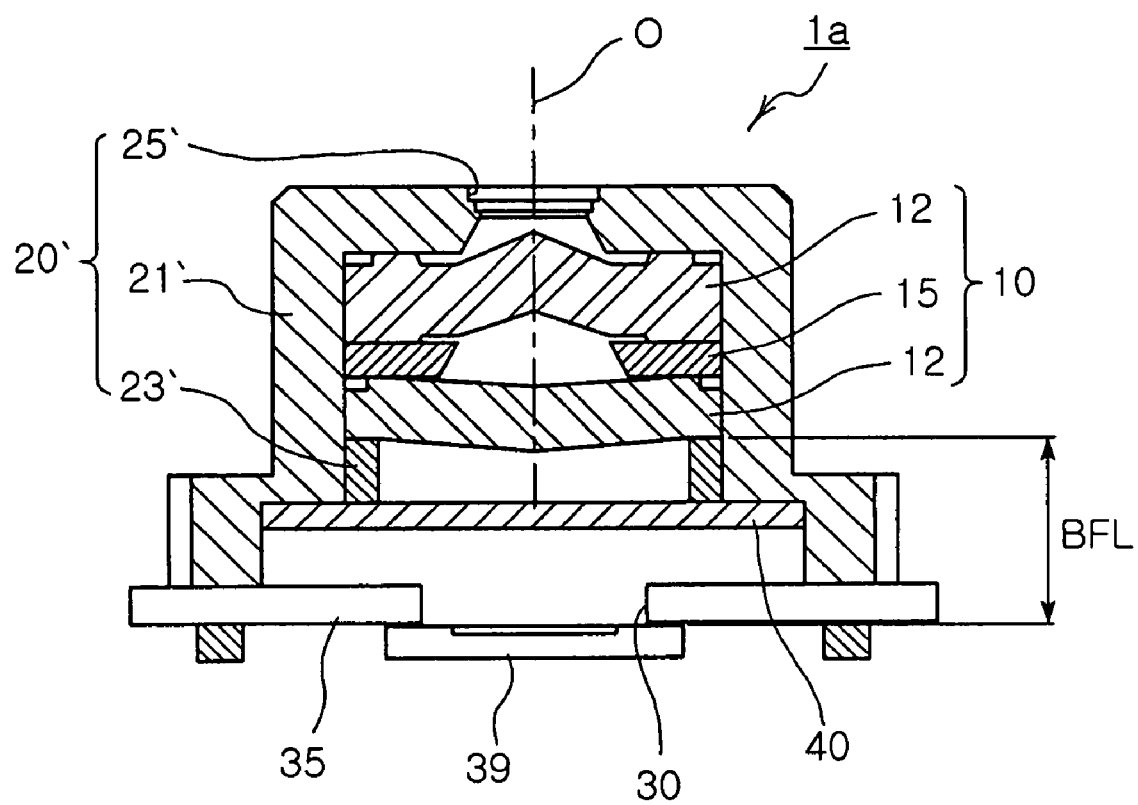
FIG. 6 is a sectional view illustrating an assembly of a nonadjustable focusing type camera module according to a fourth preferred embodiment of the present invention.

FIG. 6 is a sectional view illustrating an assembly of a nonadjustable focusing type camera module 1a according to a fourth preferred embodiment of the present invention. As shown in the drawing, the image sensor may be mounted on the lower surface of the substrate having a window 39 by flip-chip bonding such that the image forming plane provided on the upper surface of the image sensor 30 is exposed to the exterior.

Meanwhile, when the camera modules 1 and 1a according to the preferred embodiments of the present invention, as shown in FIGS. 3a and 3b are assembled, in a case that the lens accommodating part 20 is assembled by screwing the upper cap 23 to the upper side of the hollow cylindrical barrel 21, firstly, the lens assembly 10 having at least one lens 12 is inserted into the inner space of the barrel 21 through the opened upper side thereof and the lower end of the lens assembly 10 is locked by the stopper 29 protruded from the lower inner surface of the barrel 21 so that the lens assembly 10 is disposed in the inner space of the barrel 21 without separation.

At that time, when the lens assembly 10 includes at least two lenses 12, the spacer 15 is disposed between the lenses 12 to maintain a gap between the lenses 12 with a predetermined distance.

Moreover, the filter 40 is mounted to the lower end of the barrel 21 by adhesive to cut ultraviolet rays contained in the light beam passing through the lens assembly 10.

In this state, the male thread as the first coupling part 21a formed in the upper side of the barrel 21 is screwed into the female thread as the first corresponding coupling part 23a formed in the lower side of the upper cap 23 so that the upper end of the lens assembly 10 contacts the stopper 29 and the lens assembly 10 arranged in the inner space of the barrel 21 is pressed toward the image sensor 30 according to fastening force between the barrel 21 and the upper cap 23, thereby closely contacting the barrel 21.

In the state that the lower end of the lens assembly 10 in which the lens assembly 10 and the filter 40 are installed is faced to the upper surface of the substrate 35 in which the image sensor 30 is installed, the first upper positioning part 51, protruded from the lower end of the barrel 21 in the form of a pin at a predetermined height, is inserted into the first lower positioning part 52 formed in the upper surface of the substrate 35 in the form of a pinhole at a predetermined depth so that the position for assembling the lens assembly 20 and the centers of the lens assembly 10 and the image forming plane provided on the image sensor 30 are aligned with the optical axis O.

Moreover, the lens accommodating part 20 is mounted on the upper surface of the substrate 35, on which the image sensor 30 is mounted by wire bonding or flip-chip bonding, by adhesive disposed between the lower end of the barrel 21 and the upper surface of the substrate 35.

Meanwhile, as shown in FIGS. 5a and 5b, in the case that the lens accommodating part 20' is assembled by fitting the cap 23' into the opened lower inner circumference of the barrel 21', the lens assembly 10 having at least one lens 12 is inserted from the lower side into the upper side through the opened lower side of the barrel 21' and the lens assembly 10 contacts the front side of the barrel 21' having the incident hole 25' without separation, whereby the lenses 12 are arranged in the barrel 21'.

Like the above-preferred embodiment, when the lens assembly 10 includes a plurality of the lenses 12, the spacer 15 is disposed between the lenses 12 to maintain gaps between the lenses 12 with a predetermined distance.

Moreover, in the state that the ring-shaped lower cap 23' is disposed at the opened lower side of the barrel 21' in which the lens assembly 10 is installed, when the lower cap 23' is fitted into the inner circumference of the barrel 21' by applying an external force from the lower side to the upper side of the barrel 21', the lens assembly 10 is pressed toward the incident hole 25' according to the intensity of the external force and closely contacts the barrel 21'.

When the fitting of the lower cap 23' into the barrel 21' is finished, the filter 40 is mounted in the lower side of the barrel 21' by adhesive, and lens accommodating part 20' in which the lens assembly 10 and the filter 40 are installed is positioned by coupling between the second upper positioning part 51' of the barrel 21' and the second lower positioning part 52' of the substrate 35, also the center of the image forming plane provided on the upper surface of the image sensor 30 is aligned with the optical axis O.

Like the above-preferred embodiment, the lens accommodating part 20' is mounted on the upper surface of the substrate 35, on which the image sensor 30 is mounted by wire bonding or flip-chip bonding, by adhesive disposed between the lower end of the barrel 21' and the upper surface of the substrate 35.

Meanwhile, after the lens accommodating part and the substrate are fixed to each other, a back focal length (BFL), being the distance between the lens 12 of the lens assembly 10 and the image forming plane of the image sensor 30, is set in advance in order to construct the nonadjustable focusing type structure so as to eliminate the focusing process for focusing the lens assembly on the image forming plane of the image sensor 30, and to ensure the error of the BFL preferably ranges within ±20 μm.

Due to this, when the lens accommodating part 20 is mounted on the upper surface of the substrate 35 in which the image sensor 30 is installed and the BFL is within the error range, the camera module according to the preferred embodiment of the present invention can be manufactured without the focusing process of adjusting the focusing distance between the lens assembly 10 and the image sensor 30 after assembling the lenses, the marking process of marking the checked positions, the UV bond coating process, and the hardening process.

As described above, according to the present invention, since it is simple to design a mold, the design time is shortened, manufacturing costs of the mold and material costs are reduced because the components in which the lenses are accommodated and the components mounted on the substrate are integrally formed, the competitive power of the camera module according to the present invention increases in view of costs and the volume of the camera module can be also minimized so that it is possible to rapidly respond to user's various demands.

Moreover, since the manufacturing process of the camera module according to the present invention is simpler than the conventional manufacturing process, the number of workers in the assembling line can be reduced and can save the investment for the plant.

Additionally, since image deterioration such as black spots, displayed on the screen, caused by foreign matter generated from a screwed portion between the conventional housing and the conventional barrel dropping from the filter, can be fundamentally prevented, the reliability can be enhanced.

Moreover, since the sizes of the lenses and the spacer accommodated in the lens accommodating part can be enlarged, it is possible to design a high performance lens so that the optical characteristics of the camera module can be enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nonadjustable focusing type camera module comprising:
    a lens assembly including at least one lens;
    a lens accommodating part mounted on an upper surface of a substrate, and including a barrel having an inner space in which the lens assembly is arranged along an optical axis, and an upper cap having an incident hole formed in the front center thereof and fixed to an upper side of the barrel to apply pressure to the lens assembly along the optical axis;
    an image sensor having an image forming plane on which a light beam passed through the lens is focused and electrically connected to the substrate to transmit the focused image; and
    at least one filter disposed between the lens assembly and the image sensor wherein the barrel includes a first coupling part formed in the upper side of the barrel corresponding to a lower side of the upper cap, and the upper cap includes a first corresponding coupling part coupled with the first coupling part of the barrel.

2. The nonadjustable focusing type camera module as set forth in claim 1, wherein the lens assembly includes multiple lenses, and further includes at least one spacer for maintaining a gap between the lenses.

3. The nonadjustable focusing type camera module as set forth in claim 1, wherein the first coupling part and the first corresponding coupling part have a female thread and a male thread to be screwed to each other respectively.

4. The nonadjustable focusing type camera module as set forth in claim 1, wherein the barrel includes at least one first upper positioning part formed in the lower end thereof corresponding to the upper surface of the substrate, and the substrate includes a first lower positioning part formed in the upper surface thereof corresponding to the upper end of the barrel and coupled with the first upper positioning part.

5. The nonadjustable focusing type camera module as set forth in claim 4, wherein the first upper positioning part and the first lower positioning part are formed in the form of a pin and a pinhole respectively such that the first upper positioning part is inserted into the first lower positioning part.

6. The nonadjustable focusing type camera module as set forth in claim 1, wherein the barrel includes a stopper protruded from the inner surface thereof to lock an end lens of the lens assembly.

7. The nonadjustable focusing type camera module as set forth in claim 1, wherein the filter comprises an IR filter positioned and fixed to the lower end of the barrel by adhesive.

8. The nonadjustable focusing type camera module as set forth in claim 1, wherein the filter comprises an IR filter attached to the upper surface of the image sensor corresponding to an image region of the image sensor.

9. The nonadjustable focusing type camera module as set forth in claim 1, wherein a back focal length between an end lens of the lens assembly and the image forming plane of the image sensor is maintained within an error range of ±20 μm.

10. The nonadjustable focusing type camera module as set forth in claim 1, wherein the image sensor comprises a sensor mounted on the upper surface of the substrate by wire-bonding.

11. The nonadjustable focusing type camera module as set forth in claim 1, wherein the image sensor comprises a sensor mounted on the lower surface of the substrate by flip-chip bonding such that the image forming plane is exposed through a window penetrating the upper surface of the substrate.

12. A nonadjustable focusing type camera module comprising:
    a lens assembly including at least one lens;
    a lens accommodating part mounted on an upper surface of a substrate, and
    including a barrel having an inner space in which the lens assembly is arranged along an optical axis and an incident hole formed in the front center thereof, and a lower cap fixed to the lower side of the barrel to apply pressure to the lens assembly along the optical axis;

an image sensor having an image forming plane on which a light beam passed through the lens is focused and electrically connected to the substrate to transmit the focused image; and at least one filter disposed between the lens assembly and the image sensor, wherein the barrel includes at least one upper positioning part formed in a lower end of the barrel corresponding to the upper surface of the substrate, and the substrate includes at least one lower positioning part formed in the upper surface of the substrate corresponding to an upper end of the barrel and coupled with the at least one upper positioning part of the barrel.

13. The nonadjustable focusing type camera module as set forth in claim 12, wherein the lens assembly includes multiple lenses, and further includes at least one spacer for maintaining a gap between the lenses.

14. The nonadjustable focusing type camera module as set forth in claim 12, wherein said upper positioning part of the barrel and said lower positioning part of the substrate are formed in the form of a pin and a pinhole respectively such that said upper positioning part of the barrel is inserted into said lower positioning part of the substrate.

15. The nonadjustable focusing type camera module as set forth in claim 12, wherein the lower cap comprises a pressing member fitted into the inner circumference of the barrel by an external force applied from the lower side of the barrel to the lens assembly.

16. The nonadjustable focusing type camera module as set forth in claim 12, wherein the lower cap comprises a ring-shaped member having a predetermined opening formed in the central portion thereof through which the light beam entering through the incident hole and the lens assembly passes toward the image sensor without interference.

17. The nonadjustable focusing type camera module as set forth in claim 12, wherein the lower cap comprises a transparent cylindrical member through which the light beam passes toward the image sensor without refraction.

18. The nonadjustable focusing type camera module as set forth in claim 12, wherein the filter comprises an IR filter positioned and fixed to the lower end of the barrel by adhesive.

19. The nonadjustable focusing type camera module as set forth in claim 12, wherein the filter comprises an IR filter attached to the upper surface of the image sensor corresponding to an image region of the image sensor.

20. The nonadjustable focusing type camera module as set forth in claim 12, wherein a back focal length between an end lens of the lens assembly and the image forming plane of the image sensor is maintained within an error range of ±20 μm.

21. The nonadjustable focusing type camera module as set forth in claim 12, wherein the image sensor comprises a sensor mounted on the upper surface of the substrate in a wire-bonding.

22. The nonadjustable focusing type camera module as set forth in claim 12, wherein the image sensor comprises a sensor mounted on the lower surface of the substrate by flip-chip bonding such that the image forming plane is exposed through a window penetrating the upper surface of the substrate.

* * * * *